(12) United States Patent
Hughes

(10) Patent No.: US 6,657,477 B2
(45) Date of Patent: Dec. 2, 2003

(54) INTEGRATED CIRCUIT

(75) Inventor: John B. Hughes, Hove (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/139,197

(22) Filed: May 6, 2002

(65) Prior Publication Data

US 2002/0163380 A1 Nov. 7, 2002

(30) Foreign Application Priority Data

May 4, 2001 (GB) ............................................. 0111140
Jul. 6, 2001 (GB) ............................................. 0116494

(51) Int. Cl.[7] ................................................ H03K 3/01
(52) U.S. Cl. ..................................................... 327/534
(58) Field of Search ........................... 326/33; 327/530, 327/534, 535, 540, 541

(56) References Cited

U.S. PATENT DOCUMENTS

| | | | |
|---|---|---|---|
| 4,368,435 A | 1/1983 | Bloy ........................... | 330/133 |
| 4,924,564 A | 5/1990 | Shah ........................... | 126/512 |
| 5,260,704 A | 11/1993 | Hustig et al. ................ | 341/144 |
| 5,305,467 A | 4/1994 | Herndon et al. ........... | 455/56.1 |
| 5,311,116 A | 5/1994 | Rogers ....................... | 324/72.5 |
| 6,198,392 B1 * | 3/2001 | Hahn et al. ............... | 340/572.4 |

FOREIGN PATENT DOCUMENTS

EP      0326251 A1    1/1989    ............ H03G/3/00

* cited by examiner

Primary Examiner—Jeffrey Zweizig
(74) Attorney, Agent, or Firm—Steven R. Biren

(57) ABSTRACT

An integrated circuit (100) comprising an analogue circuit (30) and optionally a digital circuit (50) couples substrate noise present on the integrated circuit ground rail (114) onto a supply rail (116) of the analogue circuit. The voltage difference between the supply rail and ground is therefore substantially independent of the noise, thereby reducing or eliminating the impact of the noise on signals in the analogue circuit.

14 Claims, 7 Drawing Sheets

INTEGRATED CIRCUIT

The present invention relates to an integrated circuit comprising an analogue circuit and having means to reduce the impact of substrate noise on signals in the analogue circuit, and has application particularly, but not exclusively, to mixed signal integrated circuits comprising analogue and digital circuits in which the digital circuits generate substrate noise.

The switching of logic gates in a digital integrated circuit can cause large transient currents to flow in the power supply rails within the integrated circuit. These transient currents constitute noise on the power supply rails. Digital circuits are robust in the presence of such noise but, in a mixed signal integrated circuit, if analogue circuits use the same power rails this noise can corrupt the analogue signals.

The problem of mixing analogue and digital circuits on the same integrated circuit will be described with reference to FIG. 1. FIG. 1 is a schematic diagram showing an integrated circuit chip 100 comprising an analogue circuit 30 and a digital circuit 50. The digital circuit 50 comprises CMOS logic gates. The switching of the CMOS logic gates causes large transient currents to flow into a power source 300 via bond wire inductances 101, 103. The flow of the transient currents in the bond wire inductances causes a disturbance, termed substrate noise, on the on-chip digital supply rails 112, 114 which operate at voltages $V_{ddd}$ and $V_{ssd}$ respectively. If the digital supply rails were to be used by the analogue circuit this disturbance would corrupt the analogue signals in the analogue circuit. Disturbance to $V_{ddd}$ can be prevented from corrupting the analogue signals by supplying the analogue circuit from a separate supply rail 110 supplying voltage $V_{dda}$, as shown in FIG. 1. However if the $V_{ssd}$ supply rail 114 is shared by both the analogue circuit and the digital circuit, disturbances to $V_{ssd}$ corrupt the analogue signals in the analogue circuit.

The analogue circuit may be supplied with two separate rails (not illustrated in FIG. 1) at voltages $V_{dda}$ and $V_{ssa}$ respectively, but if the $V_{ssa}$ rail is connected to the substrate of the integrated circuit chip then noise in the substrate modulates the effective supply ($V_{dda}$-$V_{ssa}$) changing the operating points of the analogue circuit, and also parasitic capacitances can couple the noise in the substrate into the analogue signal paths.

If the separate rail at $V_{ssa}$ is not connected to the substrate, then, assuming an N-well CMOS process, the analogue signals can be corrupted through the backgate effect in the NMOS transistors in the analogue circuit and via parasitic capacitances which couple the NMOS transistors to the substrate.

Balanced analogue circuits are often used to reduce the impact of the substrate noise but under large signal conditions the circuits become unbalanced and the analogue signals are corrupted. The problem is so serious that many systems are designed using separate chips for analogue and digital circuits so that they no longer share the same substrate but this makes a less cost effective solution.

Substrate noise can also be generated by analogue circuits operating at a high level, such as a power amplifier, which can corrupt signals in analogue circuits operating at low levels.

An object of the invention is to provide an integrated circuit having improved noise performance.

According to the invention there is provided an integrated circuit, comprising an analogue circuit coupled to first and second supply rails and coupling means for coupling noise on the first supply rail to the second supply rail.

By coupling the noise on the first supply rail onto the second supply rail, the noise is reproduced on both the first and second supply rails and the relative voltage differences between the first and second supply rails and between the internal nodes of the analogue circuit is substantially independent of the noise. In this way the impact of the noise on signals in the analogue circuit is reduced or eliminated.

The integrated circuit may also comprise a digital circuit coupled to the first supply rail. The digital circuit may be the source of the noise. The first supply rail may coupled to ground.

The integrated circuit may comprise only analogue circuitry, without any digital circuits, with the noise being generated by analogue circuitry, for example by current pulses flowing in the bond wire inductances 101, 102.

The coupling means for coupling noise on the first supply rail onto the second supply rail may comprise a power supply regulator supplying the second power rail arranged so that the noise on the first supply rail modulates the second supply rail.

The coupling means may further comprise a first capacitor means having first and second ports wherein the first port is coupled to the first supply rail and the second port is coupled to a control node of the power supply regulator such that the noise on the first supply rail is coupled to the control node and modulates a voltage supplied to the second supply rail by the power supply regulator.

The integrated circuit may also comprise a second capacitor means having first and second ports wherein the first port is coupled to the first supply rail and the second port is coupled to the second supply rail. By means of this second capacitor means, noise on the first supply rail is coupled to the second supply rail and, in conjunction with the first capacitor means, voltage fluctuations within a regulation device within the power supply regulator caused by noise can be reduced, thereby reducing the required bandwidth of the regulation device.

The invention will now be described, by way of example only, with reference to FIGS. 2 to 6.

Figure 1:
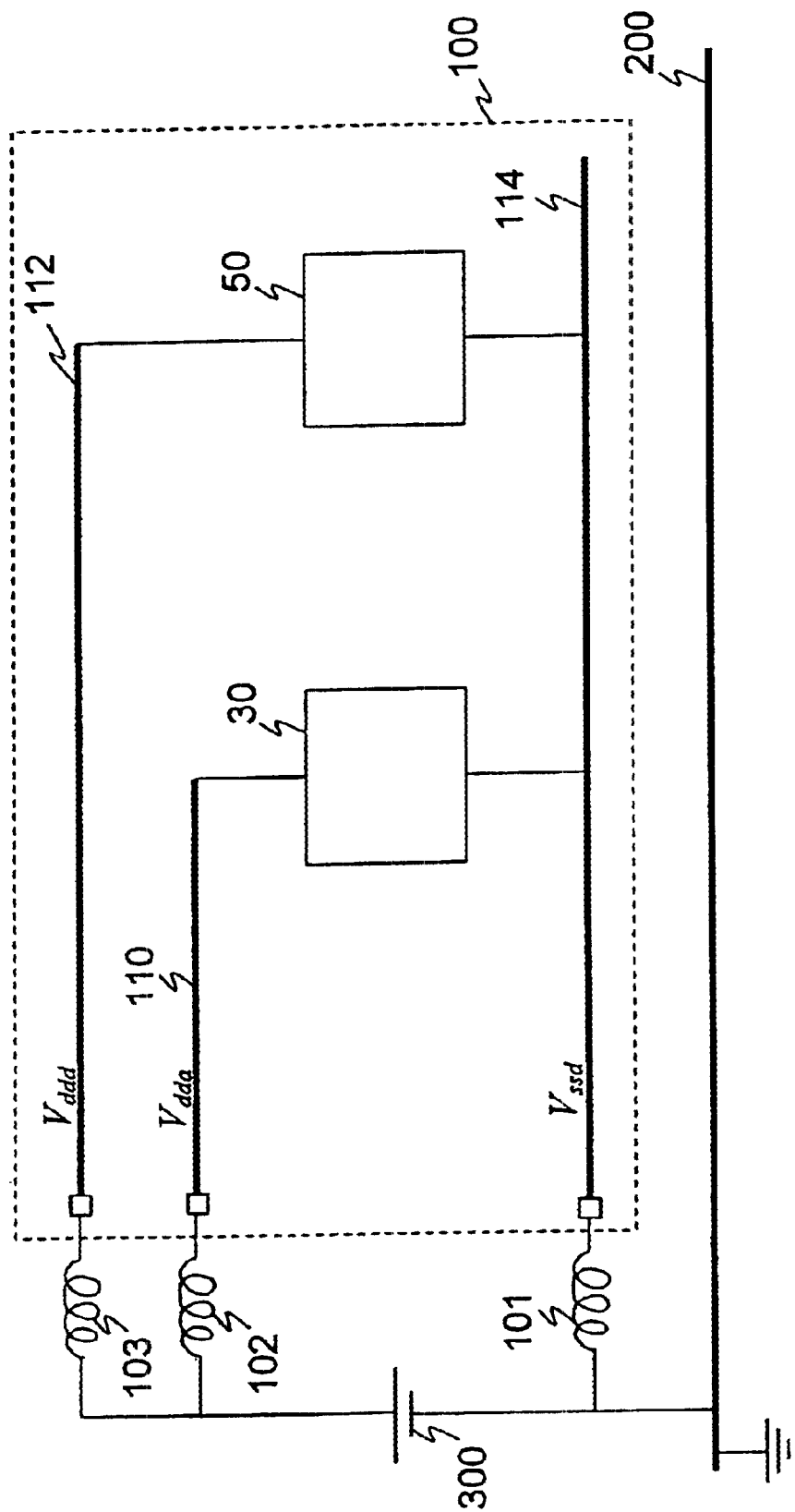
FIG. 1 is a schematic diagram of a prior art integrated circuit.
Figure 2:
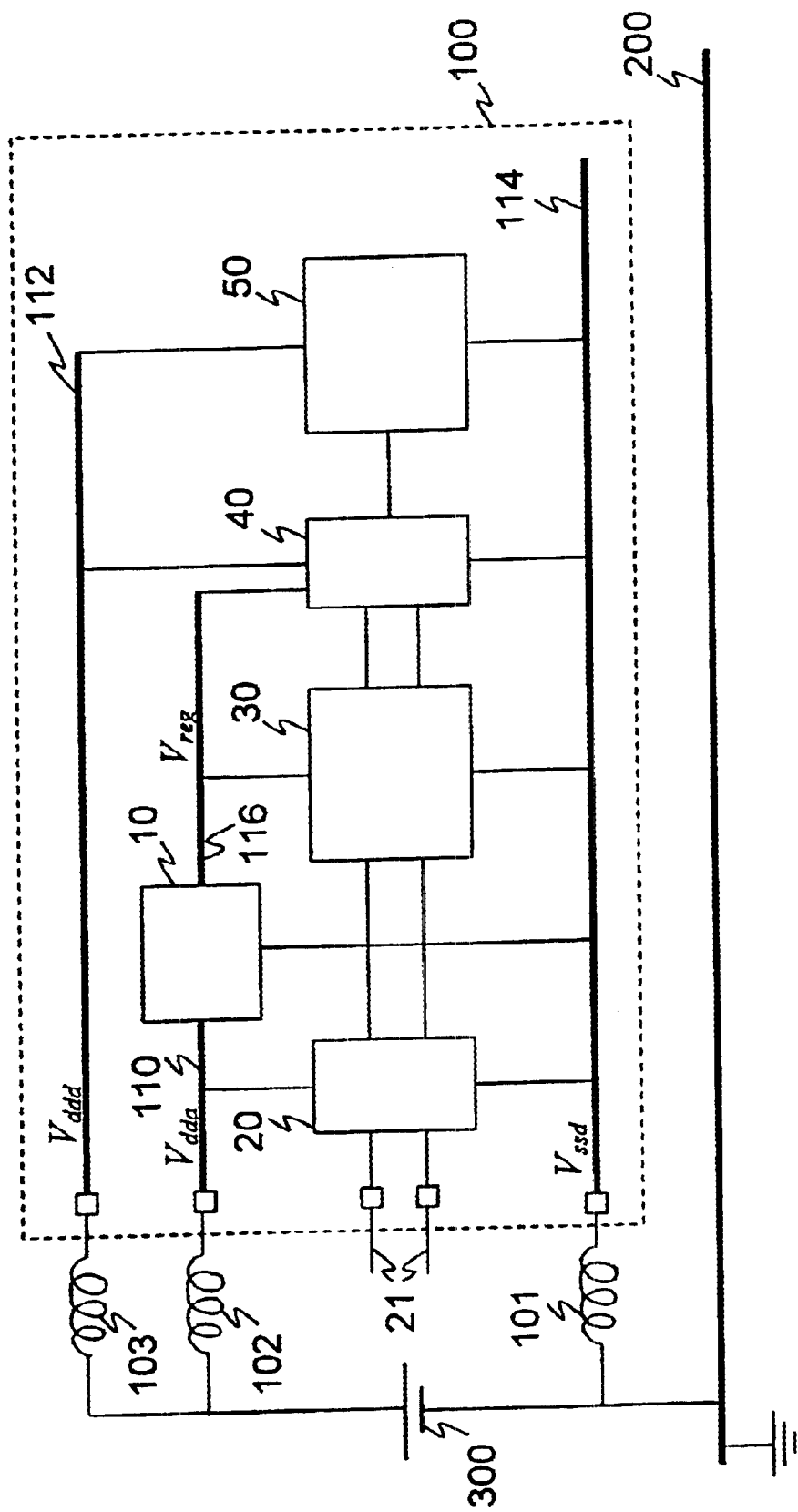
FIG. 2 is a schematic diagram illustrating a mixed signal integrated circuit.

Referring to FIG. 2 there is an integrated circuit chip 100 comprising an analogue circuit 30 and a digital circuit 50. The analogue circuit 30 and the digital circuit 50 are coupled to a common supply rail 114 supplying voltage $V_{ssd}$ which is coupled to the chip substrate. The common supply rail 114 is coupled to the negative supply terminal of an off-chip power source 300 by means of a bond wire having a bond wire inductance 101. The negative supply terminal of the power source 300 is coupled to ground by means of a ground line 200 on a printed circuit board (PCB) on which the integrated circuit chip 100 is mounted.

The digital circuit 50 is coupled to a first positive supply rail 112 supplying voltage $V_{ddd}$, and the first positive supply rail 112 is coupled to the positive supply terminal of the power source 300 by means of a bond wire having a bond wire inductance 103. There is a second positive supply rail 110 supplying voltage $V_{dda}$, coupled to the positive supply terminal of the power source 300 by means of a bond wire having a bond wire inductance 102. The second positive supply rail 110 is coupled to the first port of a power supply regulator 10. The regulator 10 delivers a regulated voltage $V_{reg}$ to a regulated supply rail 116 which is coupled to supply the analogue circuit 30. The regulator 10 is also coupled to the common supply rail 114.

Figure 3:
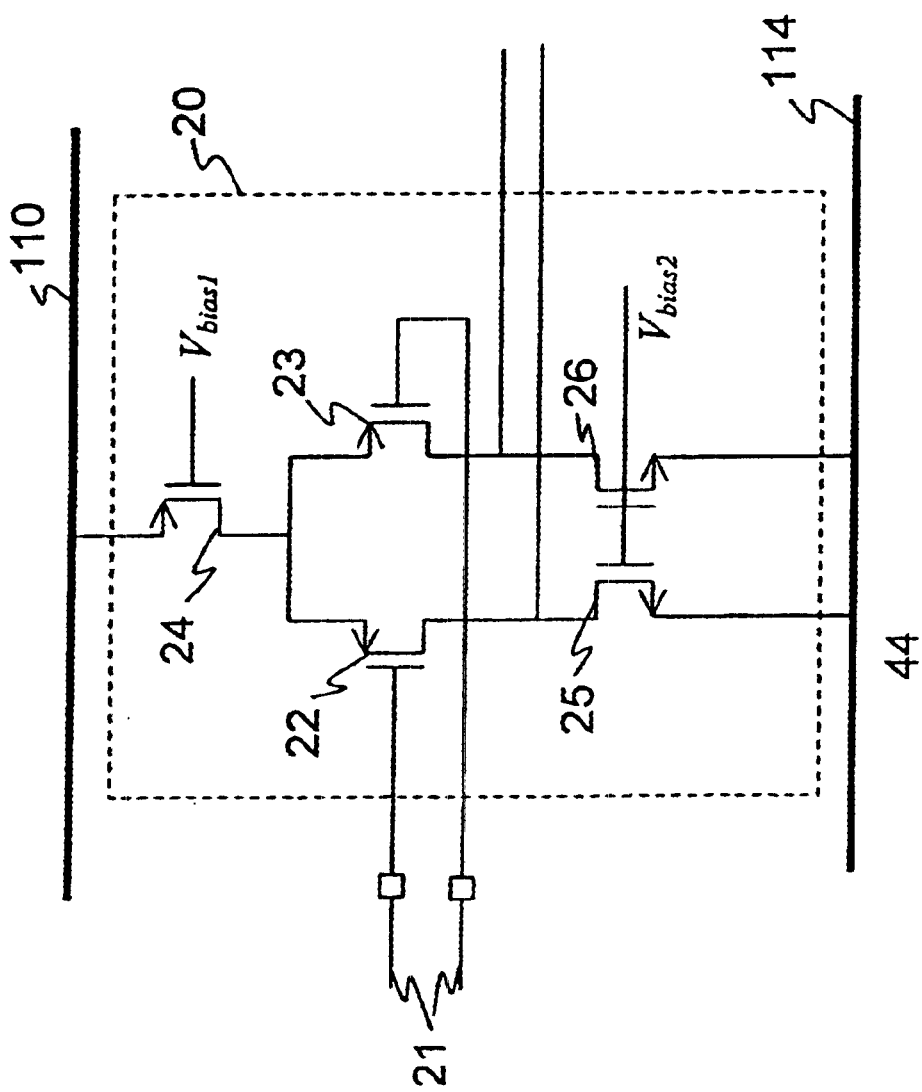
FIG. 3 is a schematic diagram of a differential stage.

Analogue signal inputs to the integrated circuit 100 comprise a pair of differential inputs 21 coupled to a differential stage 20. The differential stage is coupled to the second positive supply rail 110 and the common supply rail 114. A suitable differential stage is illustrated in FIG. 3, where the differential inputs 21 are coupled to respective gates of a pair of PMOS transistors 22, 23 that have their sources coupled together and coupled to the second positive supply rail 110. The pair of PMOS transistors 22, 23 convert a differential input voltage to a differential output current. Differential output current signals are taken from the drains of the PMOS transistors 22, 23, the drains being coupled to the common supply rail 114. Further transistors 24, 25, 26, comprising one (24) between the coupled sources of the PMOS transistors 22, 23 and the second supply rail 110, and one each (25, 26) between each drain of the PMOS transistors 22, 23 and the common supply rail 114, use reference voltages $V_{bias1}$ and $V_{bias2}$ to establish operating currents in the PMOS transistors 22, 23. Substrate noise on the common supply rail 114 is coupled to both outputs such that the differential output current is substantially noise free. Referring again to FIG. 2, differential signals delivered from the differential stage 20 are coupled to respective differential signal inputs of the analogue circuit 30.

Differential analogue signals delivered from the analogue circuit 30 are coupled to inputs of an on-chip analogue to digital converter (ADC) 40, and a digitised signal delivered by the ADC 40 is coupled to the digital circuit 50. The ADC 40 is coupled to the common supply rail 114, and the digital and analogue circuits of the ADC 40 are coupled respectively to the first positive supply rail 112 and the regulated supply rail 116.

Figure 4:
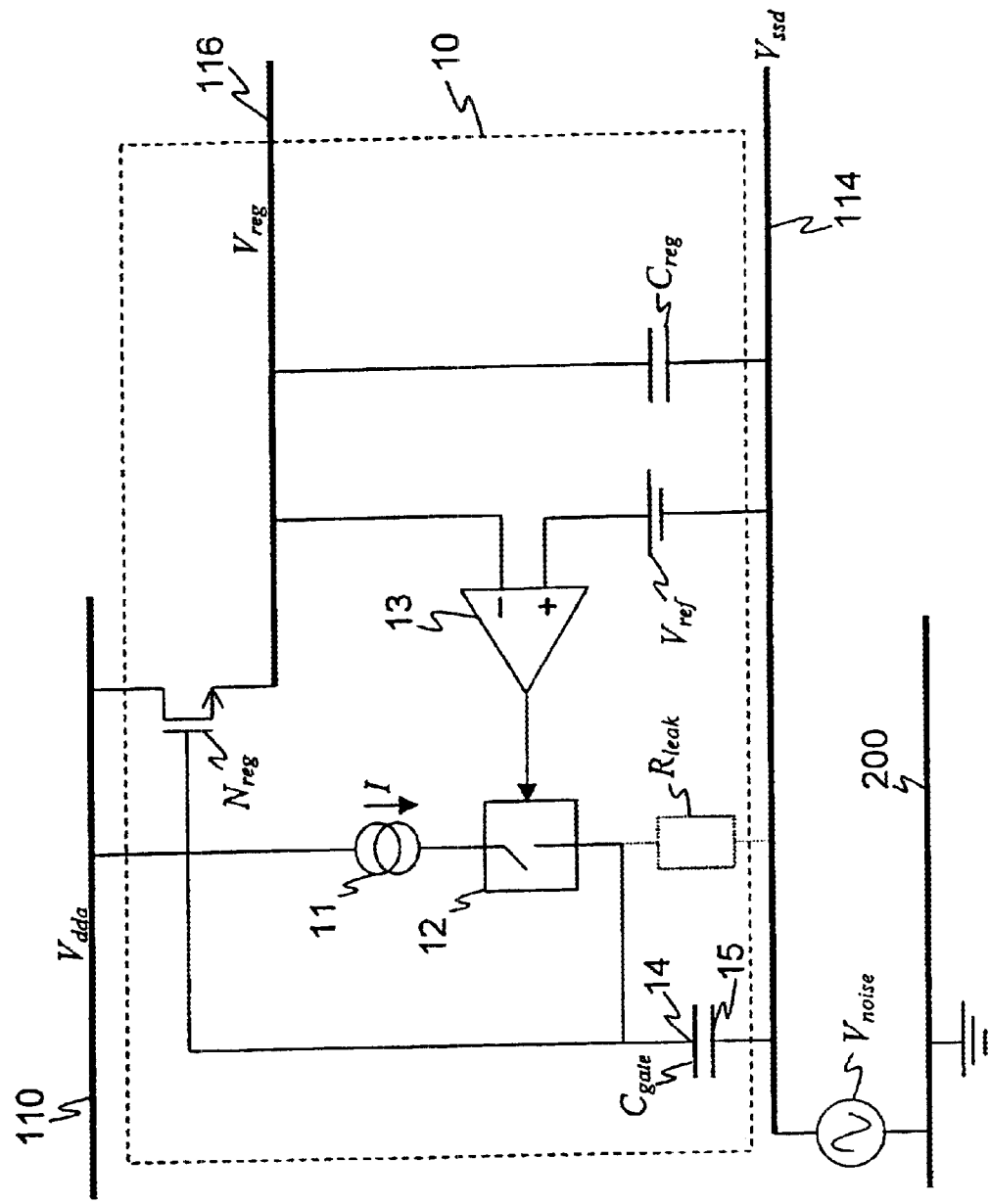
FIG. 4 is a schematic diagram of a regulator.

One embodiment of the regulator 10 is illustrated in FIG. 4 and comprises an NMOS transistor $N_{reg}$ having its drain coupled to the second positive supply rail 110 and which generates the regulated voltage $V_{reg}$ at its source which is coupled to the regulated supply rail 116. A first capacitor $C_{gate}$ has a first port 14 coupled to the gate of the transistor $N_{reg}$ and a second port 15 coupled to the common supply rail 114. A current source 11 is coupled to the regulated supply rail 116 and is also coupled to deliver a current I via a switch means 12 to the first port 14 of the first capacitor $C_{gate}$. Operation of the switch means 12 is controlled by a control signal delivered at an output of a comparator means 13. The comparator means 13 has an inverting input coupled to the regulated supply rail 116 and a non-inverting input coupled to a reference voltage $V_{ref}$. In FIG. 4 substrate noise is represented by a noise source $V_{noise}$ coupled between the common supply rail 114 and the ground line 200. A second capacitor $C_{reg}$ is coupled between the regulated supply rail 116 and the common supply rail 114.

The operation of the regulator 10 illustrated in FIG. 4 to maintain the regulated voltage $V_{reg}$ at the reference voltage $V_{ref}$ is as follows. The comparator means 13 compares the regulated voltage $V_{reg}$ with the reference voltage $V_{ref}$. If $V_{reg} < V_{ref}$ then the control signal delivered at the output of the comparator means 13 causes the switch means 12 to close such that current from the current source 11 charges the first capacitor $C_{gate}$. As a result the voltage at the first port of the capacitor $C_{gate}$ rises, causing the voltage at the gate of the transistor $N_{reg}$ to rise and consequently causing the voltage $V_{reg}$ to rise. When $V_{reg} V_{ref}$ the control signal delivered at the output of the comparator means 13 causes the switch means 12 to open such that the first capacitor $C_{gate}$ ceases to charge, thereby stabilising the regulated voltage $V_{reg}$ at the reference voltage $V_{ref}$. When regulated voltage $V_{reg}$ falls below the reference voltage $V_{ref}$ due either to current drawn from the regulator 10 by the analogue circuit 30 or to leakage of the charge on the first capacitor $C_{gate}$ (represented in FIG. 4 by resistance $R_{leak}$ in parallel with the first capacitor $C_{gate}$) the process described above repeats. The gate of the transistor $N_{reg}$ functions as a control node for the regulator 10, and this control node presents a high impedance to the first capacitor $C_{gate}$.

Substrate noise represented by the noise source $V_{noise}$ is coupled directly via the first and second capacitors, $C_{gate}$ and $C_{reg}$, and via the reference voltage $V_{ref}$ to all circuit nodes in the regulator 10, and notably to the regulated voltage $V_{reg}$. Consequently the substrate noise is coupled to all nodes of the analogue circuit 30. As all nodes of the analogue circuit 30 experience the same disturbance by noise, there is little corruption of the analogue signals within the analogue circuit 30. The inclusion of the second capacitor $C_{reg}$ is optional; by coupling the substrate noise to both the gate of the transistor $N_{reg}$, by means of the first capacitor $C_{gate}$, and the source of the transistor $N_{reg}$, by means of the second capacitor $C_{reg}$, the rate of voltage fluctuations between the gate and source of the transistor $N_{reg}$ due to the noise is reduced thereby enabling the transistor $N_{reg}$ to have a reduced bandwidth.

Figure 5:
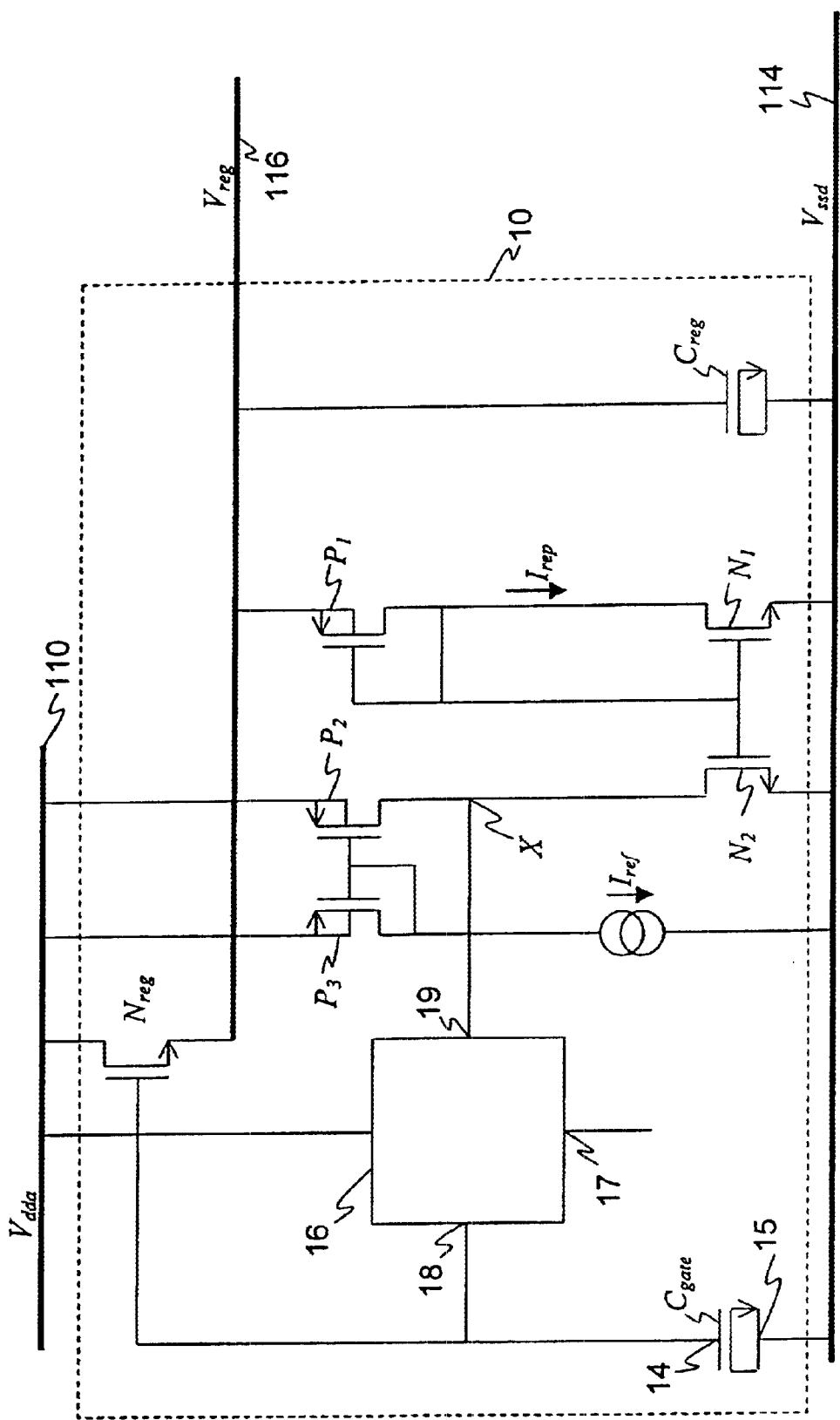
FIG. 5 is a schematic diagram of an alternative regulator.

An alternative embodiment of the regulator 10 is illustrated in FIG. 5 and is suitable for use when the analogue circuit 30 comprises class AB switched-current cells. In FIGS. 4 and 5, equivalent items have the same reference identification. Referring to FIG. 5, there is an NMOS transistor $N_{reg}$ having its drain coupled to the second positive supply rail 110 and which generates the voltage $V_{reg}$ at its source which is coupled to the regulated supply rail 116. A first capacitor $C_{gate}$ has a first port 14 coupled to the gate of the transistor $N_{reg}$ and a second port 15 coupled to the common supply rail 114. A second capacitor $C_{reg}$ is coupled between the regulated supply rail 116 and the common supply rail 114. In this embodiment, capacitors $C_{gate}$ and $C_{reg}$ are each implemented as the oxide capacitance of a transistor.

Figure 6:
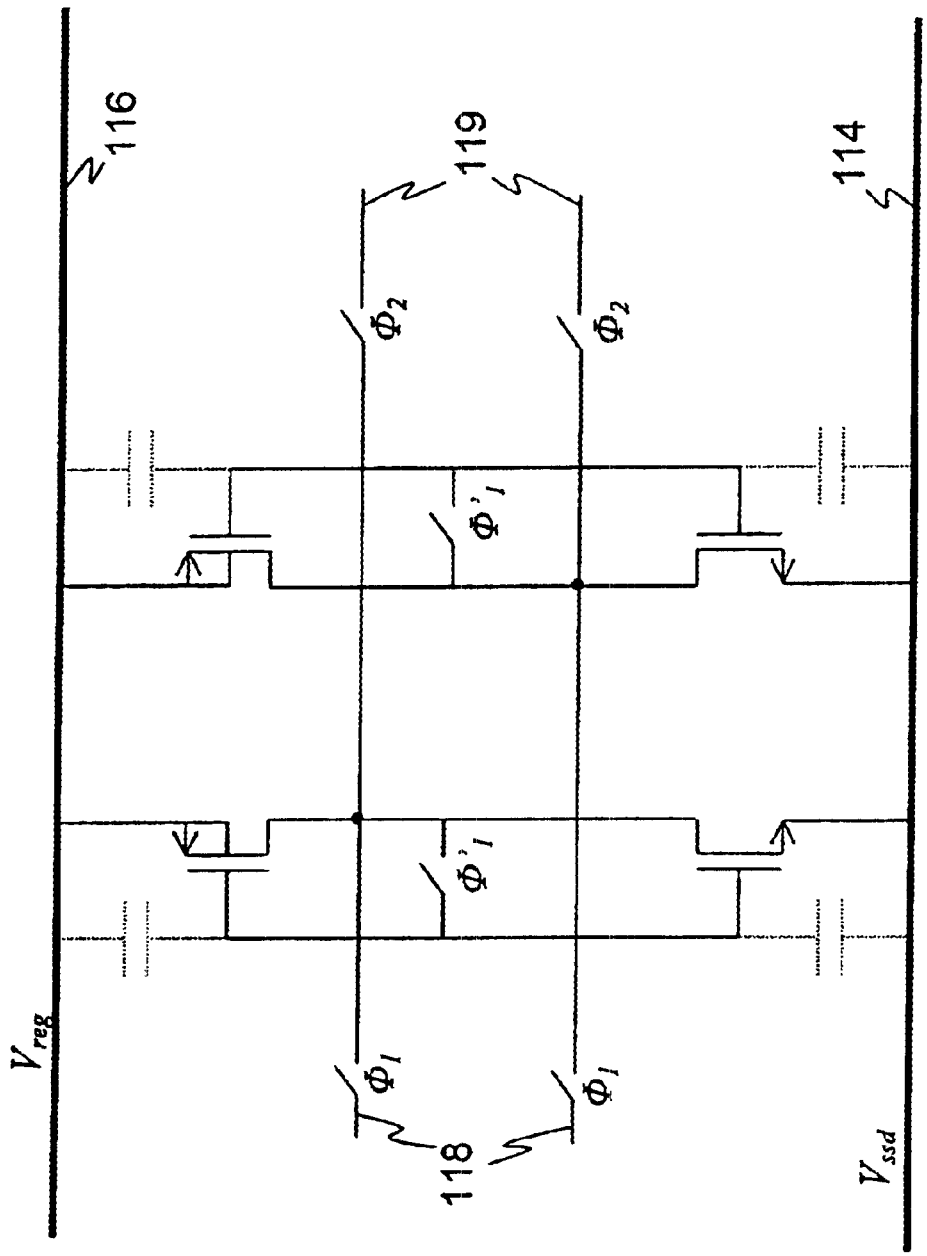
FIG. 6 is a schematic diagram of a switched current memory cell.

A class AB switched-current memory cell is illustrated in FIG. 6. It will not be described in detail as its configuration and method of operation will be known to a skilled person but, in summary, it comprises a PMOS and NMOS transistor pair for each of a differential pair of input ports 118, and input signals are stored into the memory cell by closing switches $\Phi_1$ and $\Phi'_1$ and stored signals are read out of the memory cell to a pair of output ports 119 by closing switches $\Phi_2$. The gate-source capacitance of the transistors are illustrated in FIG. 6 using dotted lines. The bias current in the memory cell illustrated in FIG. 6, when the memory cell is employed in the analogue circuit 30, is determined by the voltage $V_{reg}$ of the regulated voltage rail 116 relative to the voltage $V_{ssd}$ of the common voltage rail 114 and by the transistor properties. The bias current is regulated by regulation of $V_{reg}$.

Referring again to FIG. 5, the regulator 10 illustrated in FIG. 5 comprises a PMOS and NMOS transistor pair $P_1$, $N_1$ that replicates a transistor pair of the switched-current memory cell illustrated in FIG. 6. The source and back gate of the PMOS transistor $P_1$ are coupled to the regulated supply rail 116, the source of the NMOS transistor $N_1$ is coupled to the common supply rail 114, the drains and gates of $P_1$ and $N_1$ are coupled together. The transistors used for $P_1$ and $N_1$ have the same sizes as those in the memory cell to ensure an accurate replica. Therefore the current $I_{rep}$ flowing through the transistor pair $P_1$, $N_1$ replicates the bias current flowing through each switched-current cell in the analogue circuit 30.

There is a further PMOS transistor $P_3$ that has its source and back gate coupled to the first positive supply rail 110 and its drain coupled to its gate and to the common supply rail 114 via a reference current generator that generates a reference current $I_{ref}$. There is a further PMOS and NMOS transistor pair $P_2$, $N_2$. The source and back gate of $P_2$ are coupled to the first positive supply rail 110, the drains of $P_2$ and $N_2$ are coupled together, and the source of $N_2$ is coupled to the common supply rail 114. The gates of $P_2$ and $P_3$ are coupled together, and the gates of $N_1$ and $N_2$ are coupled together.

Figure 7:
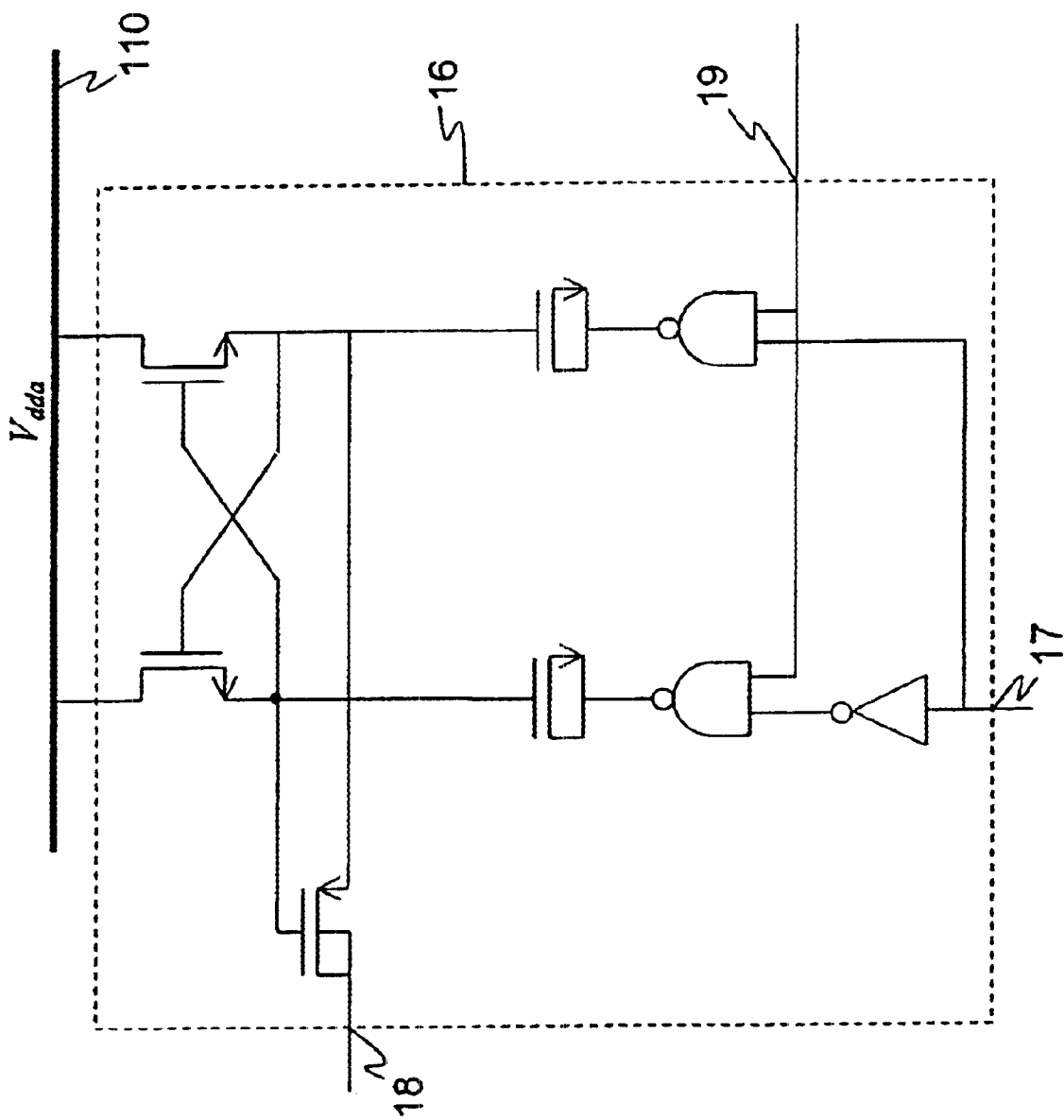
FIG. 7 is a schematic diagram of a charge pump.

Also in FIG. 5 there is a charge pump means 16 which derives its power from the second positive supply rail 110. The charge pump means 16 has an output 18 coupled to charge the capacitor $C_{gate}$, and a control input 19 coupled to the drains of transistors $P_2$ and $N_2$ to enable and disable the supply of charge to the capacitor $C_{gate}$. The charge pump means 16 is supplied with a clock signal on an input 17. The clock source is not illustrated in FIG. 5. An embodiment of the charge pump means 16 is shown in FIG. 7 but will not be described as its configuration and method of operation will be known to a skilled person.

The operation of the regulator 10 illustrated in FIG. 5 to maintain the regulated voltage $V_{reg}$ at the reference voltage $V_{ref}$ is as follows. The reference current $I_{ref}$ is mirrored from transistor $P_3$ into transistor $P_2$ and the replica current $I_{rep}$ is mirrored from transistor $N_1$ into transistor $N_2$. Comparison of $I_{ref}$ and $I_{rep}$ effectively takes place at node X, which is the point at which the drains of transistors $P_2$ and $N_2$ are coupled together. If $I_{rep}<I_{ref}$, then the voltage on node X, and therefore on the control input 19, goes high and the supply of charge from the charge pump means 16 to the capacitor $C_{gate}$ is enabled. Consequently the voltage on the capacitor $C_{gate}$ rises, causing the voltage at the gate of the transistor $N_{reg}$ to rise and consequently causing the regulated voltage $V_{reg}$ to rise. The increase in $V_{reg}$ causes the replica current $I_{rep}$ to increase. When $I_{rep}=I_{ref}$ the voltage on node X, and therefore on the control input 19, goes low and the supply of charge from the charge pump means 16 to the capacitor $C_{gate}$ is disabled. As in the embodiment of FIG. 4, the gate of the transistor $N_{reg}$ functions as a control node for the regulator 10, and this control node presents a high impedance to the first capacitor $C_{gate}$.

Since the class AB switched-current cells in the analogue circuit 30 operate from the same $V_{reg}$, their bias current is stabilized at $I_{ref}$. The choice of a charge pump means 16 in the regulator 10 of FIG. 5 has the advantage over the current source 11 in the regulator 10 of FIG. 4 of being able to generate voltages on $C_{gate}$ above $V_{dda}$. This allows the regulator 10 to be designed with low headroom between $V_{dda}$ and $V_{reg}$ so that low voltage operation is feasible.

The invention is applicable to both voltage or current domain analogue cells. The regulator illustrated in FIG. 4 is suitable for either voltage or current domain analogue cells. The regulator illustrated in FIG. 5 is suitable for current domain analogue cells.

What is claimed is:

1. An integrated circuit, comprising an analogue circuit coupled to first and second supply rails and coupling means for coupling noise on the first supply rail to the second supply rail, wherein the coupling means comprises a power supply regulator supplying the second supply rail and wherein the noise on the first supply rail modulates the second supply rail.

2. An integrated circuit as claimed in claim 1, comprising a digital circuit coupled to the first supply rail.

3. An integrated circuit as claimed in claim 1, wherein the power supply regulator comprises a first capacitor means having first and second ports wherein the first port is coupled to the first supply rail and the second port is coupled to a control node of the power supply regulator such that the noise on the first supply rail is coupled to the control node and modulates a voltage supplied to the second supply rail by the power supply regulator.

4. An integrated circuit as claimed in claim 3, comprising a second capacitor means having first and second ports wherein the first port is coupled to the first supply rail and the second port is coupled to the second supply rail.

5. An integrated circuit as claimed in claim 1, wherein the analogue circuit comprises an analogue-to digital converter.

6. An integrated circuit as claimed in claim 1, comprising a differential input stage coupled to a third supply rail.

7. An integrated circuit comprising:
   a digital circuit coupled to a first supply rail and a common supply rail;
   an analogue circuit coupled to a second supply rail and the common supply rail; and
   a regulator that modulates the second supply rail responsive to noise on the common supply rail.

8. The integrated circuit of claim 7, wherein said regulator comprises a capacitor coupled between the common supply rail and a control node of said regulator, such that noise on the common supply rail is coupled to the control node and modulates a voltage supplied to the second supply rail.

9. The integrated circuit of claim 8, wherein said regulator further comprises a second capacitor coupled between the second supply rail and the common supply rail.

10. The integrated circuit of claim 8, wherein said regulator further comprises a current source that selectively charges the capacitor responsive to noise on the common supply rail.

11. The integrated circuit of claim 8, wherein said regulator further comprises a charge pump that selectively charges the capacitor responsive to noise on the common supply rail.

12. The integrated circuit of claim 7, further comprising a differential circuit, coupled to a third supply rail and the common supply rail, that provides differential signals to said analogue circuit responsive to a signal input to the integrated circuit.

13. The integrated circuit of claim 12, further comprising an analogue/digital converter, coupled to the first supply rail and the common supply rail, that provides a digital signal to said digital circuit responsive to the differential signals.

14. The integrated circuit of claim 7, wherein said digital circuit, said analogue circuit and said regulator are incorporated on a chip substrate, and the common supply rail is coupled to a ground line of a printed circuit board on which the integrated circuit is mounted.

* * * * *